(12) United States Patent
Vaysman et al.

(10) Patent No.: US 9,343,165 B2
(45) Date of Patent: May 17, 2016

(54) DYNAMIC DRIVE STRENGTH OPTIMIZATION

(71) Applicants: Dmitry Vaysman, Beer-Sheva (IL); Arkady Katz, Beer-Sheva (IL)

(72) Inventors: Dmitry Vaysman, Beer-Sheva (IL); Arkady Katz, Beer-Sheva (IL)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/778,894

(22) Filed: Feb. 27, 2013

(65) Prior Publication Data

US 2014/0185388 A1   Jul. 3, 2014

Related U.S. Application Data

(60) Provisional application No. 61/747,470, filed on Dec. 31, 2012.

(51) Int. Cl.
*G11C 16/30* (2006.01)
*G06F 13/40* (2006.01)

(52) U.S. Cl.
CPC .......... *G11C 16/30* (2013.01); *G06F 13/4086* (2013.01)

(58) Field of Classification Search
None
See application file for complete search history.

(56) References Cited

U.S. PATENT DOCUMENTS

| | | | |
|---|---|---|---|
| 5,444,406 A | 8/1995 | Horne | |
| 5,619,147 A * | 4/1997 | Hunley | 326/26 |
| 6,700,418 B2 | 3/2004 | Yu et al. | |
| 6,807,650 B2 | 10/2004 | Lamb et al. | |
| 7,389,194 B2 | 6/2008 | Nguyen et al. | |
| 2003/0189441 A1 | 10/2003 | Nguyen et al. | |
| 2006/0158198 A1 | 7/2006 | Fujisawa | |
| 2011/0141827 A1 | 6/2011 | Mozak et al. | |
| 2012/0042116 A1 | 2/2012 | Park et al. | |

FOREIGN PATENT DOCUMENTS

| | | | |
|---|---|---|---|
| FR | WO2012009318 | * | 1/2012 |
| FR | WO20120009318 | * | 1/2012 |
| WO | WO 2012/009318 A1 | | 1/2012 |
| WO | WO2012009318 | * | 1/2012 |

OTHER PUBLICATIONS

Anritsu 2010 note, Mar. 2010, Anritsu applications note.*
International Search Report and Written Opinion mailed May 8, 2014 for PCT Application No. PCT/US2013/075759.
International Preliminary Report on Patentability and Written Opinion of the International Searching Authority issued Jun. 30, 2015 for PCT Application No. PCT/US2013/075759.

* cited by examiner

*Primary Examiner* — James G Norman
(74) *Attorney, Agent, or Firm* — Brinks Gilson & Lione

(57) ABSTRACT

A system for optimizing drive strength may be utilized for identifying the maximum data transfer rate for different devices and different device configurations. The drive strength may be optimized for input/output (I/O) devices by measuring voltage drops on I/O power supply using different test patterns. The maximum drive strength is identified that satisfies a limit or threshold for the allowed voltage drop level. The test pattern may include a simultaneous toggling of each I/O device. A slew rate for the device may be utilized along with the drive strength for identifying the maximum data transfer rate.

23 Claims, 14 Drawing Sheets

DYNAMIC DRIVE STRENGTH OPTIMIZATION

PRIORITY

This application claims priority to U.S. Prov. App. No. 61/747,470, titled "DYNAMIC DRIVE STRENGTH OPTIMIZATION," filed on Dec. 31, 2012, the entire disclosure of which is hereby incorporated by reference.

TECHNICAL FIELD

This application relates generally to memory devices and systems. More specifically, this application relates to optimizing the drive strength of the memory controller input/output devices.

BACKGROUND

Non-volatile memory systems, such as flash memory, have been widely adopted for use in consumer products. Flash memory may be found in different forms, for example in the form of a portable memory card that can be carried between host devices or as a solid state disk ("SSD") or embedded memory devices (iNAND, iSSD, etc.) embedded in a host device. Memory systems may be utilized for data storage with data transfers between a memory device and its host. The transfer may be managed by a memory controller as a part of a memory device. The data may be transferred at high frequency or bit/rate and the maximum data rate may be limited by a quality of the transferred data. There may be different standards (DDR, SD, eMMC, etc.) that determine how the memory device or memory controller are designed, as well as standards for maintaining the quality of the high speed data. A memory controller may control the high speed data transfer process with Input/Output ("I/O" or "IO") devices that may be designed for maintaining the required quality of the high speed data. The I/O devices may have different driver capabilities that can be adjusted by changing a Drive Strength ("DS") of the output driver. The DS parameter may be used for maintaining the required data quality, while a mismatch in the DS can cause a malfunction of the memory system. Some memory controller devices utilize a constant DS value over a product's life that is not adjustable. Other devices may allow for the modification of DS by utilizing an external resistor that is not adjustable for different high-speed interfaces. The lack of an ability to adjust the DS when the system parameters are changed may result in reduced signal quality and reduced data speed for transfers.

SUMMARY

It may be desirable to implement a system and method for optimizing and improving high level transfer of data in a memory system. A self-learning mechanism may determine the required drive strength ("DS") value depending on a system configuration and operating conditions. The system configuration may include the number of NAND dies and the types of substrate or printed circuit boards. The operating conditions may include process, voltage and temperature variations. Accordingly, the optimization process may dynamically update the drive strength of I/O devices for changes to the system configuration or changes to the operating conditions. The optimization may be based on a measurement of the supply voltage or power delivery network.

DETAILED DESCRIPTION

Figure 1:
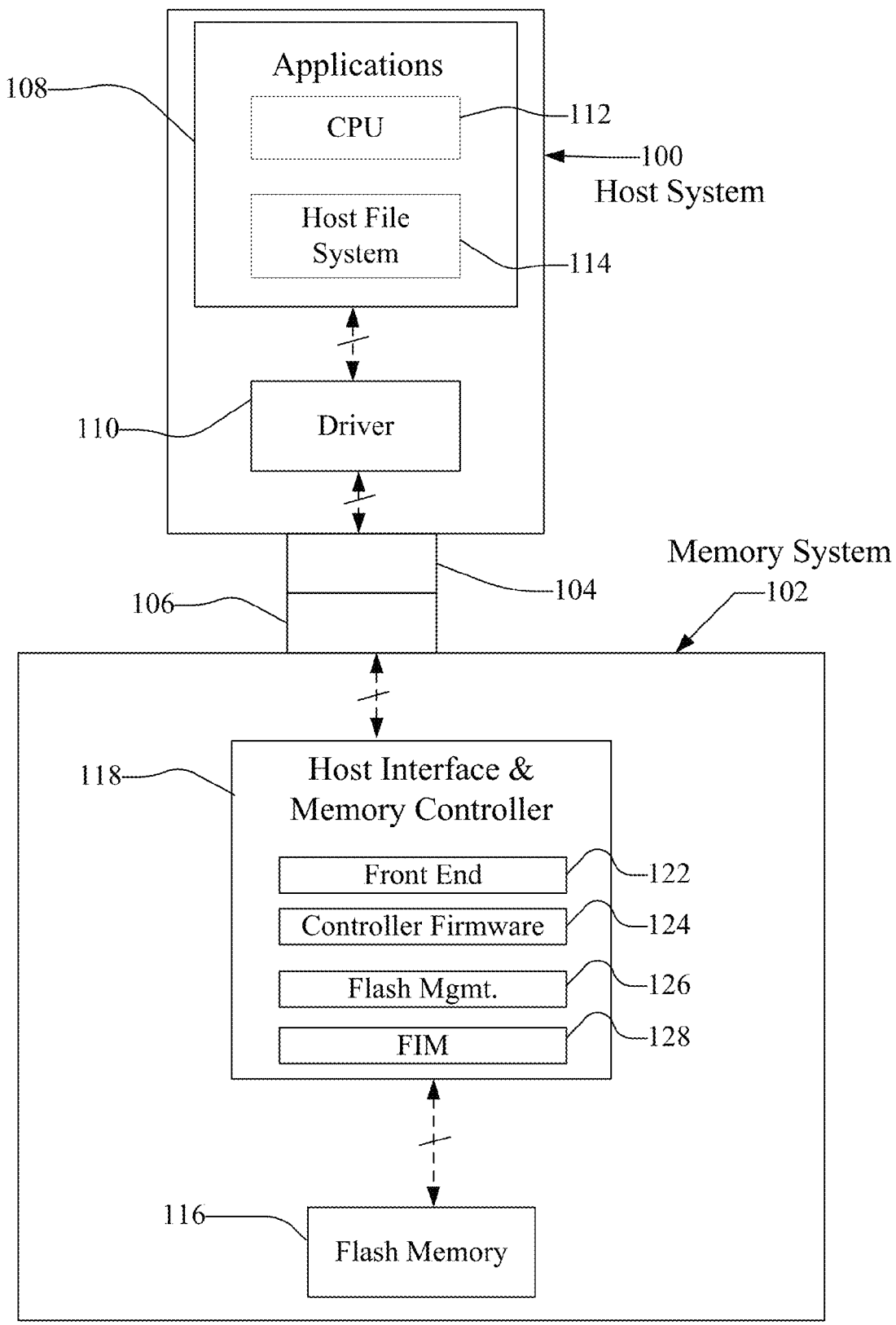
FIG. 1 is a block diagram of a host connected with a memory system having multiple dies of a non-volatile memory.

A flash memory system suitable for use in implementing aspects of the invention is shown in FIGS. 1-3, 5-6, and 11-12. A host system 100 of FIG. 1 stores data into and retrieves data from a flash memory system 102. The flash memory may be embedded within the host, such as in the form of a solid state disk (SSD) drive installed in a personal computer. Alternatively, the memory system 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them. As discussed below, the controllers may internally manage operations of the flash memory.

Host systems that may use SSDs, iNANDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on an Application Specific Integrated Circuit ("ASIC").

The host system 100 of FIG. 1 may be viewed as having two major parts, insofar as the memory system 102 is concerned, made up of a combination of circuitry and software. They are an applications portion 108 and a driver portion 110 that interfaces with the memory 102. There may be a central processing unit (CPU) 112 implemented in circuitry and a host file system 114 implemented in hardware. In a PC, for example, the applications portion 108 may include a processor 112 running word processing, graphics, control or other popular application software. In a camera, cellular telephone or other host system 114 that is primarily dedicated to performing a single set of functions, the applications portion 108 includes the software that operates the camera to take and store pictures, the cellular telephone to make and receive calls, and the like.

The memory system 102 of FIG. 1 may include non-volatile memory, such as flash memory 116, and a memory controller 118. The memory controller interfaces with the host 100, to which the memory system 102 is connected, for passing data back and forth from the host to the memory, and controls the memory 116. The memory controller 118 may convert between logical addresses of data used by the host 100 and physical addresses of the flash memory 116 during data programming and reading. The memory controller 118 may retranslate logical addresses. Functionally, the memory controller 118 may include a host interface 122 that interfaces with the host system, controller logic 124 for coordinating operation of the memory 116, flash management logic 126 for internal memory management operations such as garbage collection, and one or more flash interface modules (FIMs) 128 or memory interfaces to provide a communication interface between the controller with the flash memory 116. In one embodiment, the flash management logic 126 performs drive strength optimization as described with respect to FIGS. 7-10.

Figure 2:
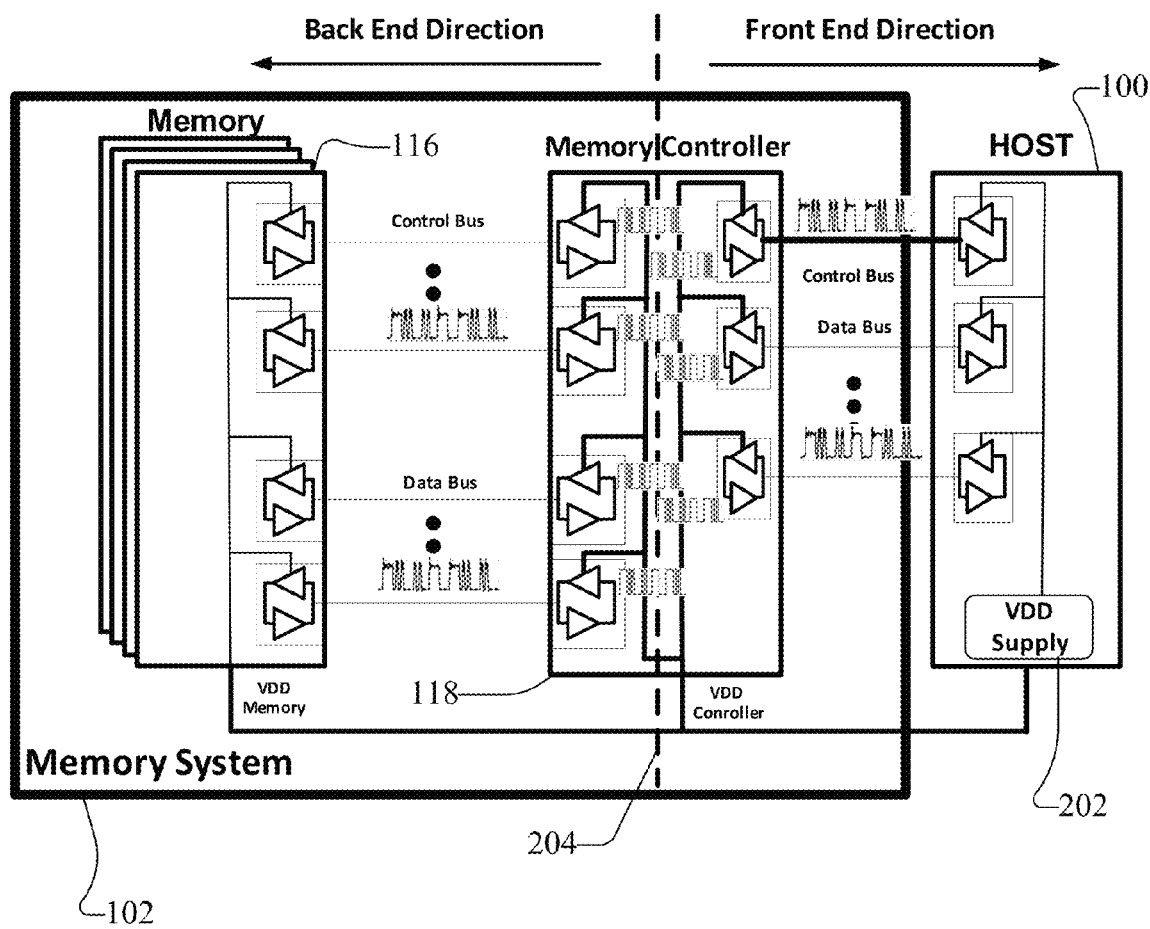
FIG. 2 is another block diagram of a host connected with a memory system.

FIG. 2 is another block diagram of a host connected with a memory system. A host 100 is coupled with a memory system 102 that includes a memory controller 118 and memory 116. As shown in FIG. 2, the memory 116 comprises a plurality of memory dies. The components may be the same as or different from like numbered components illustrated in FIG. 1. The memory controller 118 is further described with respect to FIG. 5. The memory controller 118 may be coupled with the memory 116 through a control bus and a data bus. Likewise, the host 100 may be coupled with the memory controller 118 through a control bus and a data bus. The host 100 may include a power supply 202 ("VDD supply") that provides a power supply to the memory controller 118 ("VDD Controller") and to the memory 116 ("VDD Memory").

The memory 116, memory controller 118, and the host 100 may include one or more input/output ("I/O" or "IO") devices through which the busses transmit information. The I/O devices may be interfaces between the components. In particular, the memory 116 includes four I/O's, the controller 118 includes seven I/O's, and the host 100 includes three I/O's displayed in FIG. 2. The controller I/O's include four back end I/O's to communicate with the four I/O's in the memory and three front end I/O's to communicate with the three I/O's in the host. Divider 204 illustrates a front end direction and a back end direction. In particular, the front end direction is to the host 100 and the back end direction is to the memory 116. The I/O devices may be different for back end and front end operations. The number of back end I/O devices may be higher than the number of front end I/O devices. In the front end direction, the host may control the I/O's. In one embodiment, the back-end direction may be fixed because the flash die/dies on the PCB may be wire-bonded and it may not be able to be changed. Accordingly, the front-end direction algorithm may be different. VDD voltage may be measured with the controller on the bus that is going to the back end direction. As shown, the controller 118 includes four I/O's that communicate in the back end direction with the memory 116 and three I/O's that communicate in the front end direction with the host 100.

Figure 3:
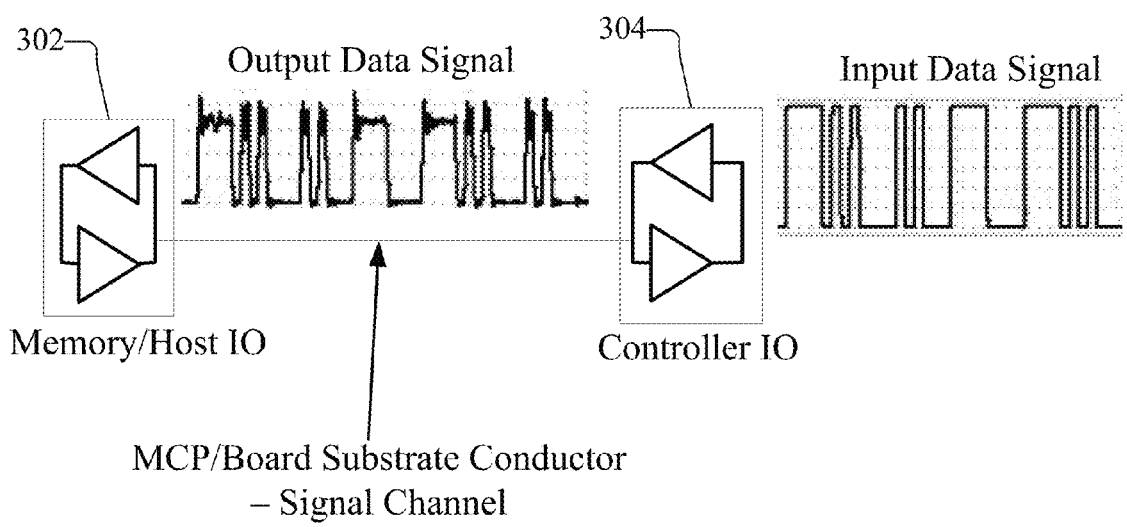
FIG. 3 is a block diagram illustrating data communications in a memory system.

FIG. 3 is a block diagram illustrating data communications in a memory system between a pair of I/O's. As shown in FIG. 2 communications may occur over a control bus or data bus between a memory controller 118 and either memory 116 or a host 100. The memory controller 118, memory 116, and host 100 may include a plurality of I/O devices (shown but not labeled in FIG. 2). Exemplary I/O devices are illustrated in FIG. 3 with a memory or host I/O 302 and a controller I/O 304. In one embodiment, the memory/host I/O 302 may be located in either the memory 116 or the host 100, while the controller I/O 304 is located in the memory controller 118. The input data signal may be received by the controller I/O 304 at the memory controller 118. Each I/O may operate as a transmitter or a receiver for either sending or receiving a signal. When an I/O operates as a transmitter, a digital signal from the controller I/O 304 input is transmitted by the controller I/O 304 output stage driver to the memory or host via a MCP substrate/printed circuit board conductor signal channel. I/O output stage drivers may be designed to drive signals between high and low voltage levels. The VDD supply of a power delivery network may establish the voltage level. The voltage level fluctuates during I/O toggling, and may be referred to as power supply 202 level. The drive strength may be optimized based on the measured voltage level as a result of I/O toggling. A test pattern may be referred to as the I/O toggling mode and may include a simultaneous switching of each I/O that may result in a maximum voltage level change. For example, I/O toggling may include triggering all of the I/O's to an on state (e.g. from 0 to 1) to generate a maximum voltage level change.

Figure 4:
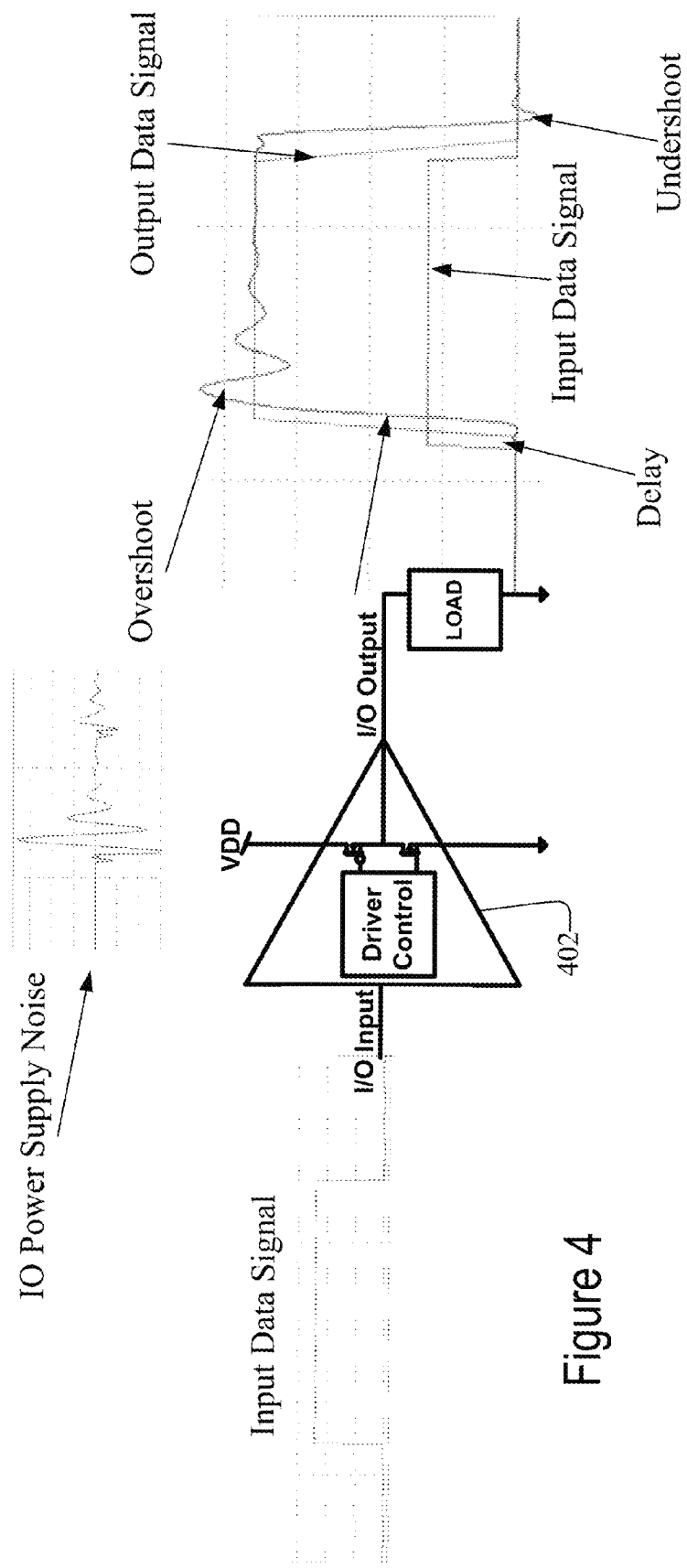
FIG. 4 is a diagram illustrating input and output signals of the data I/O output driver.

FIG. 4 is a diagram illustrating input and output signals from an I/O device. An I/O device 402 may include a driver or driver control logic block, and may be connected to a power supply VDD, which is the I/O power supply. The I/O device 402 may receive an I/O Input and may provide an I/O Output (also referred to as the Output Data Signal). The I/O Input or Input Data Signal may be a digital voltage level signal and is provided to the I/O. The I/O Output signal may include slight variations or noise in the data signal. In particular, the Output Data Signal (or I/O Output) is shown, but the I/O Output may have a Delay, Overshoot, and/or Undershoot as shown in FIG. 4. These variations are distortions from the Input Data Signal that occur in the I/O Output. These variations may be significant and may be caused by a signal channel (e.g. on a substrate/board) and may reduce a signal quality of the high speed data signals, when the DS is not optimized. This may result in a loss of the transmitted data between the memory and host.

There may be I/O Power Supply Noise or VDD noise, which is part of the system that results in the signal distortions (e.g. delay, overshoot, undershoot). In particular, the power source may be part of the board/host system that includes all the components and may travel to the I/O over the substrate/board via a power delivery network. Because of this travel distance and parasitic elements (e.g. inductors, capacitors) of the intermediate components (e.g. conductors), and a current consumption during I/O toggling (e.g. switching from "low" state to "high state") there may be noise on the power supply signal. The noise may be caused by a length of the conductors from when the power supply is connected and enters the board until it reaches the I/O in the controller. If driving capabilities of the I/O's output stage does not fit the output load (higher than required), the output signal may be distorted significantly (e.g. overshoot, undershoot, delay) and the power supply noise may be high. Variations in process, voltage, temperature may cause a reduced performance of the I/O output driver.

The distortions may be managed by adjusting a drive strength or impedance depending on the load connected to the I/O Output. In particular, the parameters (delay, undershoot, overshoot) may be regulated based on the VDD power supply voltage (peak or maximum value) drop. As described with respect to FIGS. 7-10, an algorithm run by the controller may identify the appropriate drive strength based on the specific system configuration (number of memory dies, length of the conductors, etc.). In one embodiment, the algorithm determines the appropriate drive strength without the use of external measurements, but by measuring the parameters inside the memory controller.

Figure 5:
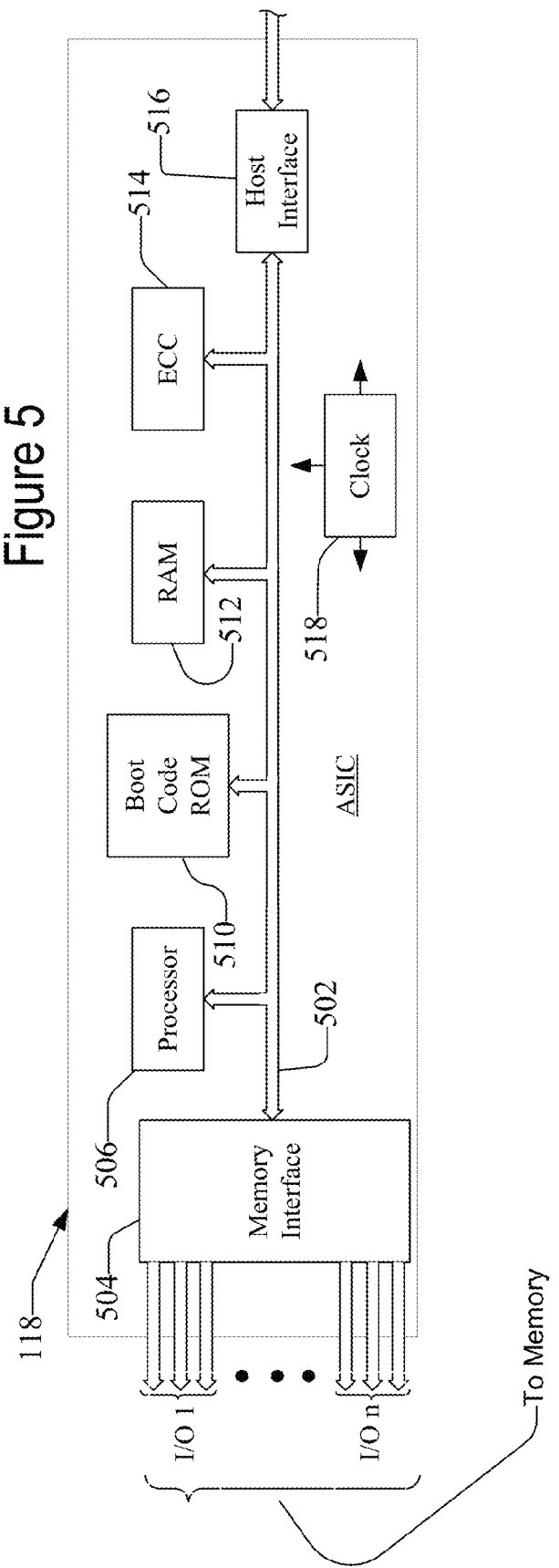
FIG. 5 is a block diagram of an exemplary flash memory system controller for use in the system of FIG. 1.

The memory controller 118 may be implemented on an application specific integrated circuit (ASIC) such as shown in FIG. 5. The processor 506 of the memory controller 118 may be configured as a multi-thread processor capable of communicating via a memory interface 504 having I/O ports for each data line to the memory bank in the flash memory 116. The memory interface 504 may include the FIM 128 from FIG. 1. The memory controller 118 may include an internal clock 518. The processor 506 communicates with an error correction code (ECC) module 514, a RAM buffer 512, a host interface 516, and boot code ROM 510 via an internal data bus 502. The host interface 516 may be part of the front end 122 from FIG. 1. The ROM 510 may be used to initialize a memory system 102, such as a flash memory device. The memory system 102 that is initialized may be referred to as a memory card or embedded memory device. The ROM 510 in FIG. 5 may be a region of read only memory whose purpose is to provide boot code to the RAM for processing a program, such as the initialization and booting of the memory system 102. The ROM may be present in the ASIC rather than the flash memory chip.

Figure 6:
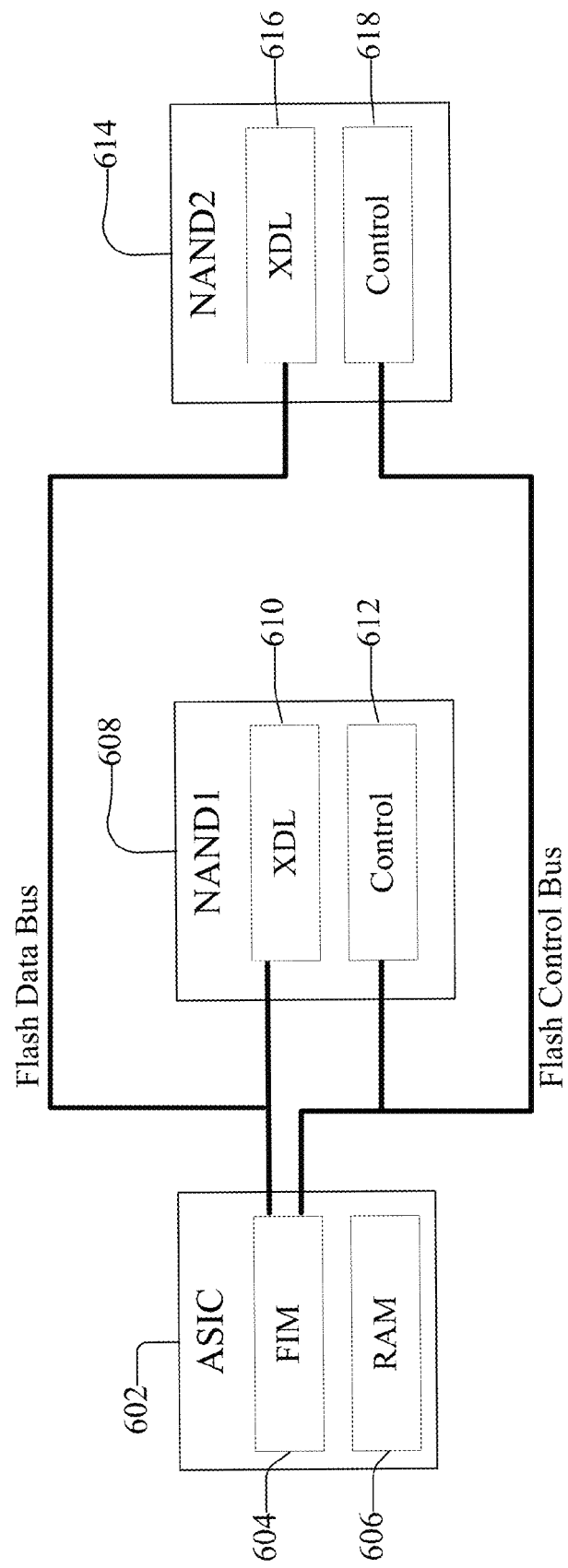
FIG. 6 is a block diagram of an alternative memory communication system.

FIG. 6 is a block diagram of an alternative memory communication system. An application-specific integrated circuit (ASIC) 602 may include a flash interface module (FIM) 604 and random access memory (RAM) 606. The ASIC 602 may be a chip that communicates with multiple flash memory modules or devices, such as NANDs 608, 614. The FIM 604 communicates data over the flash data bus and communicates control commands over the flash control bus. The NAND1 608 and NAND2 614 are types of flash memory that receive commands and data from the FIM 604 of the ASIC 602. Each of the NAND1 608 and NAND2 614 include controls 612, 618, respectively, for receiving control signals from the ASIC 602. Likewise, each of the NAND1 608 and NAND2 614 include an eXternal Data Latch (XDL) 610, 616, respectively, for receiving data signals from the ASIC 602. Although the flash data bus and flash control bus are illustrated as separate busses that communicate with the XDL 610, 616 and Control 612, 618 of the respective NANDs 608, 614, there may be a singular bus for communication.

Flash memory may include memory cells that may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 7:
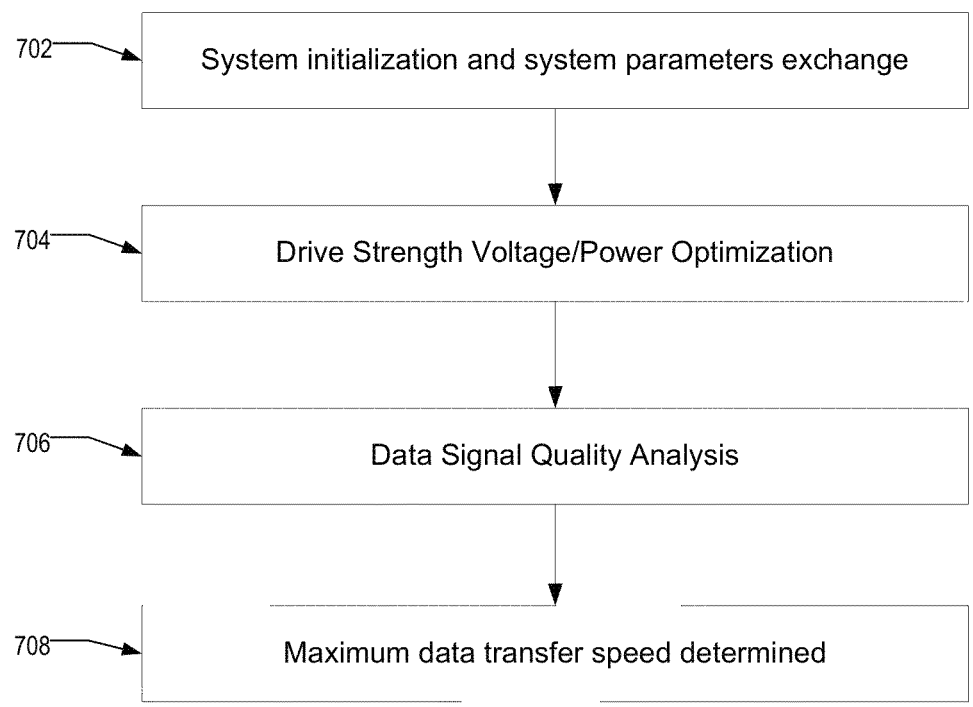
FIG. 7 is a diagram of drive strength optimization.

FIG. 7 is a diagram of drive strength optimization algorithm. The optimization may be utilized by the controller for input/output ("I/O") operations. In block 702, the system is initialized and system parameters are exchanged. The system initialization may include a system boot in which the controller exchanges system parameters with either the memory or the host. The system parameters may include configuration (e.g. the number of memory dice) and target speed. In block 704, there may be a first phase for the drive strength optimization that includes voltage/power optimization. The first phase optimization in block 704 determines an optimal drive strength for driving an I/O. In other words, a determination is made as to whether an output driver for an I/O device drive a particular load. In block 706, the second phase of drive strength optimization may include a signal quality analysis or data signal quality optimization. A slew rate level (V/nanosecond) of a data signal can be measured by the memory controller and compared with a target value. The slew rate value may be in the specified limits for a certain data signal speed. If the slew rate value is lower than the low limit, the signal may not be good enough to be recognized by the memory/host and it should be improved. The improvement of the data signal can be done by connecting a termination network existing in the memory (e.g. on-die termination, which may be referred to as termination circuitry) in order to improve the signal. In one embodiment, the results from the second phase may be used for an on-die termination operation decision. If the signal quality is sufficient for being read by the NAND or host, then the signal is of sufficient quality. The first phase for voltage/power optimization is further described with respect to FIG. 8 and FIG. 9 below. The second phase for the analysis is further described with respect to FIG. 10 below for an embodiment utilizing a slew rate measurement. In block 708, the maximum data transfer speed is determined after both phases of optimization.

Figure 8:
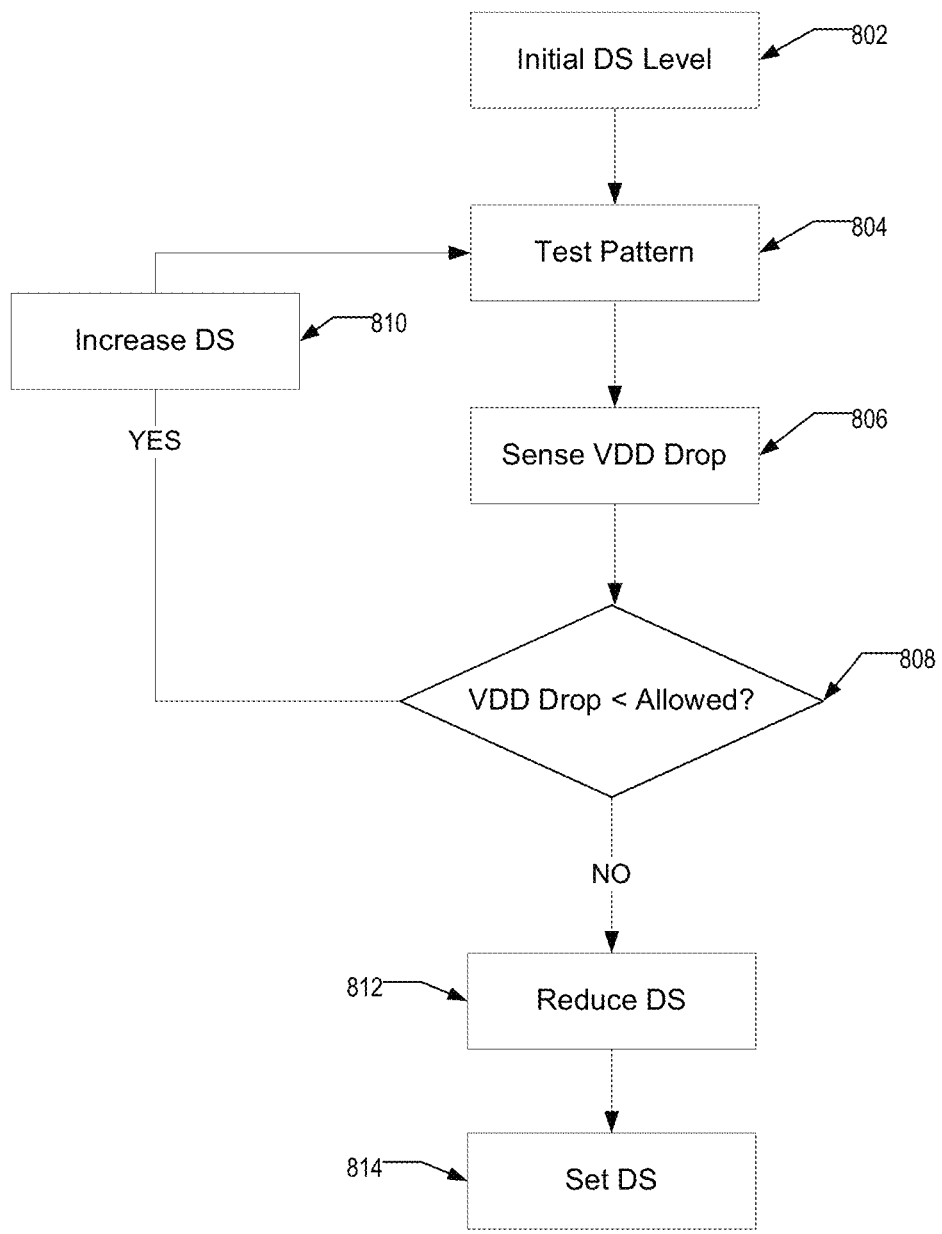
FIG. 8 is a diagram of drive strength optimization based on voltage/power.

FIG. 8 is a diagram of drive strength optimization based on voltage/power parameters. The blocks of FIG. 8 may be performed by the controller 118 in one embodiment. In block 802, an initial drive strength ("DS") level is set. The DS may be a voltage value. In one example, the DS value may be zero. There may be test pattern utilized in block 804. The test pattern may include a switching of I/O components together which may be used for the maximum current consumption from the VDD supply that may result in the maximum voltage drop of the VDD signal. The test pattern may also be referred to as I/O toggling mode, including a logical toggling from 0 to 1 or switching on/off to generate the maximum voltage change. In order to test the maximum current consumption from the VDD supply source, all the I/O's may need to be toggled (e.g. from 0 to 1) substantially simultaneously. Testing with the maximum current consumption may generate results that can be utilized for determining the optimal drive strength. In alternative embodiments, the test pattern may be other mechanisms for achieving the maximum current consumption from the VDD supply At maximum current consumption, the distortions can be measured. As shown in block 806, a drop in the VDD voltage level is the distortion that is measured or sensed. In alternative embodiments, any distortion in the VDD voltage level (e.g. overshoot, undershoot) can be measured and the drop in voltage level is merely an exemplary measurement for an undershoot distortion measurement. The VDD voltage drop may be caused by a current consumption while I/O's are toggling simultaneously and the current consumption is maximized. This voltage drop may then be used to determine whether the drive strength is optimized. In block 808, the measured voltage level is compared with a threshold or allowed voltage peak level. In one embodiment, the allowed level may be established by a specification or a standard (e.g. DDR1-4 standards). The allowed voltage peak level may be determined based on simulation results for the memory system. If the voltage level is less than the allowed level, then the drive strength is increased in block 810 and the process is iterated form the test pattern (block 804) until the voltage level is greater than the allowed level. In block 812, the drive strength is reduced when the voltage level is not less than the allowed level. In the case of the undershoot measurement the voltage may be negative, and the amplitude measurement of this voltage may be as an absolute value that is compared with a target value. The increase of the drive strength in block 810 or the decrease in drive strength in block 812 may be with a predetermined amount that can be decreased for a finer or more accurate setting of the drive strength. The increasing and decreasing of the DS may be based on a single unit of measurement or may be infinitely variable. In other words, the amount in which the DS is increased in block 810 (and decreased in block 812) may be uniform for both blocks for incrementing DS, but that value may be modified. After this reduction in the drive strength, the value for the drive strength is set in block 814. The DS may be stored for future reference.

FIG. 8 illustrates one exemplary algorithm for determining whether the drive strength is optimal for a particular system. As discussed, different devices/systems/memories or other configurations may necessitate different drive strengths. In one example, the current driving capabilities at the output state of the I/O may be modified. For example, driving capabilities of an I/O may include a tolerance for a particular voltage level or voltage change. The optimal drive strength depends on the I/O load and may be the highest drive strength that the system can allow.

In an alternative embodiment, the algorithm presented in FIG. 8 may be performed without the test pattern in the front end direction. In particular, the front end operation may fail with the wrong drive strength and the host may stop supplying the power supply and the system may restart. In other words, an error condition from the incorrect drive strength may result in front end operation failure and result in a system restart with back end operation that does not require a test pattern. The drive strength value may be stored in memory and that is used when the system fails to operate or needs to be restarted. In other words, the drive strength optimization may be different for the front end direction as compared with the back end direction and the initial DS level may be stored and utilized for future optimizations.

Figure 9:
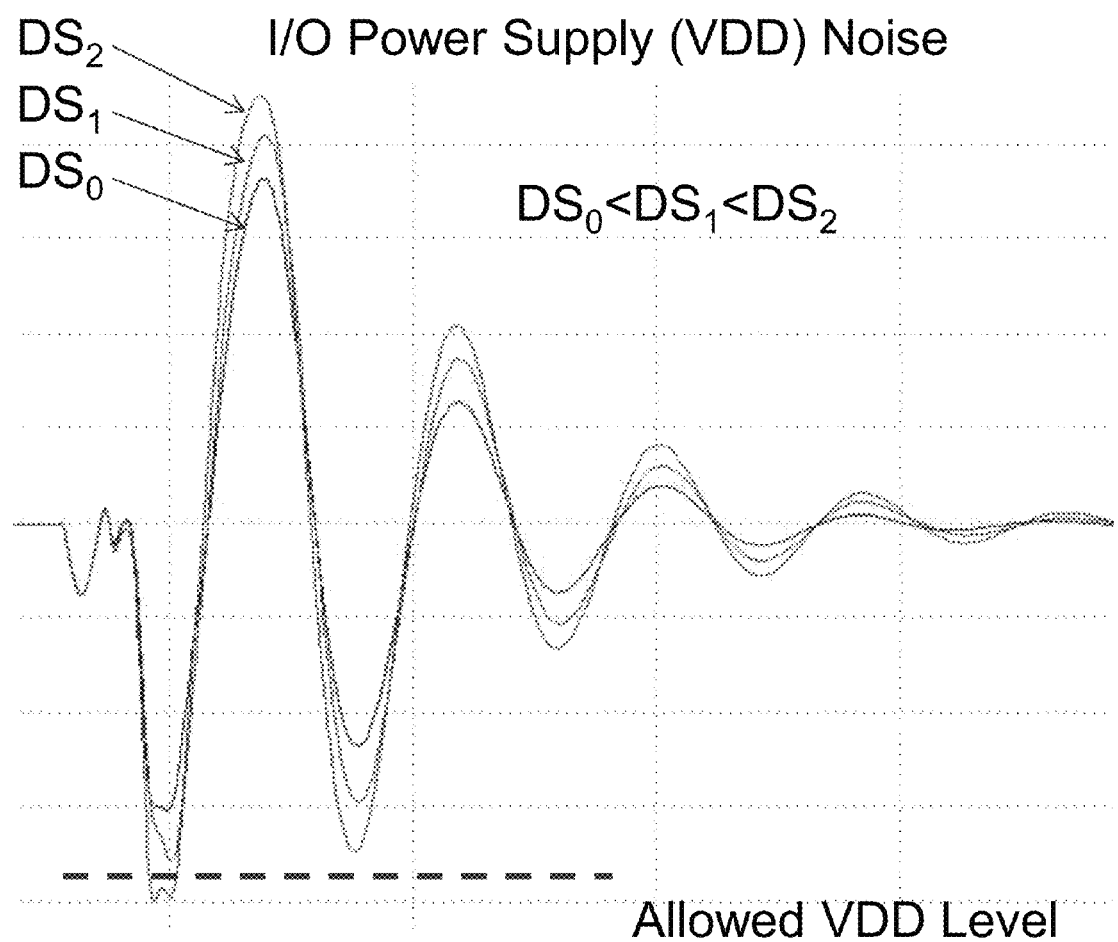
FIG. 9 is an illustration of voltage measurement.

FIG. 9 is an illustration of VDD voltage drop measurement. The VDD voltage drop may be one example of a distortion of the VDD voltage signal supplied to the I/O devices. FIG. 9 illustrates an I/O power supply noise level at three different drive strengths ($DS_0$, $DS_1$, $DS_2$). The drive strengths are in order of magnitude with $DS_0 < DS_1 < DS_2$. The allowed power supply level is shown in an undershoot scenario. In the case of $DS_2$ VDD drops below the allowed power supply level, while in both $DS_1$ and $DS_0$ cases, it is above the allowed level. If $DS_2$ has been reached and the measured voltage drop is above the allowed value, the drive strength value will be reduced back to $DS_1$ which may then be the final value. In other words, the undershoot should be limited such that it is not lower than the allowed level. However, since $DS_1$ case is closer to the allowed VDD level without crossing, it is the optimal drive strength level. $DS_1$ is the maximum drive strength that satisfies the allowed undershoot level, which may be the amplitude or peak value. FIG. 9 is an illustration that VDD voltage drop (e.g. undershoot) is different depending on the drive strength value. It may be preferable to maximize the drive strength while keeping the voltage drop below the allowed value.

The optimization of the drive strength values may be utilized to determine the optimal data frequency or data transmission rates for a particular device or configuration of a number of devices. Based on the optimal drive strength for a particular device or configuration of a number of devices, the maximum data transfer speed may be determined. The optimal drive strength that is determined as discussed above may be an input along with a configuration parameter that results in an output that is the maximum data frequency or maximum data transfer speed. In one example, the configuration parameter may include the number of dies for a memory device. In an alternative embodiment, the slew rate is calculated from FIG. 10 and is used as a data signal quality parameter, which may be a configuration parameter. Additional exemplary configuration parameters may include a length of the signal channel and a target data transfer speed.

A particular device (or product configuration) may have a table (e.g. Table 1) generated at development that reveals the maximum data frequency for a range of drive strengths and slew rates. The slew rates are utilized along with the drive strength in FIG. 10 to identify the maximum transfer speed. As shown in Table 1, there are four values of drive strength and six values of slew rate. For each combination of drive strength and slew rate, there is a maximum data transfer speed (also referred to as data frequency and identified as $F_n$ in Table 1 to illustrate different values) that can be referenced from the table. Accordingly, the optimization of drive strength may be utilized for determining a maximum data transfer rate for a particular memory system. In alternative embodiments, there may be other parameters other than slew rate that are utilized with drive strength to identify the maximum data transfer rate.

TABLE 1

Maximum Data Transfer Speed Determination

| Slew Rate | Drive Strength (DS) | | | |
| --- | --- | --- | --- | --- |
| | 00 | 01 | 10 | 11 |
| Value 1 | $F_2$ | $F_2$ | $F_2$ | $F_2$ |
| Value 2 | $F_2$ | $F_2$ | $F_2$ | $F_1$ |
| Value 3 | $F_2$ | $F_2$ | $F_2$ | $F_2$ |
| Value 4 | $F_3$ | $F_2$ | $F_1$ | $F_1$ |
| Value 5 | $F_3$ | $F_3$ | $F_3$ | $F_3$ |
| Value 6 | $F_4$ | $F_4$ | $F_4$ | $F_4$ |

Figure 10:
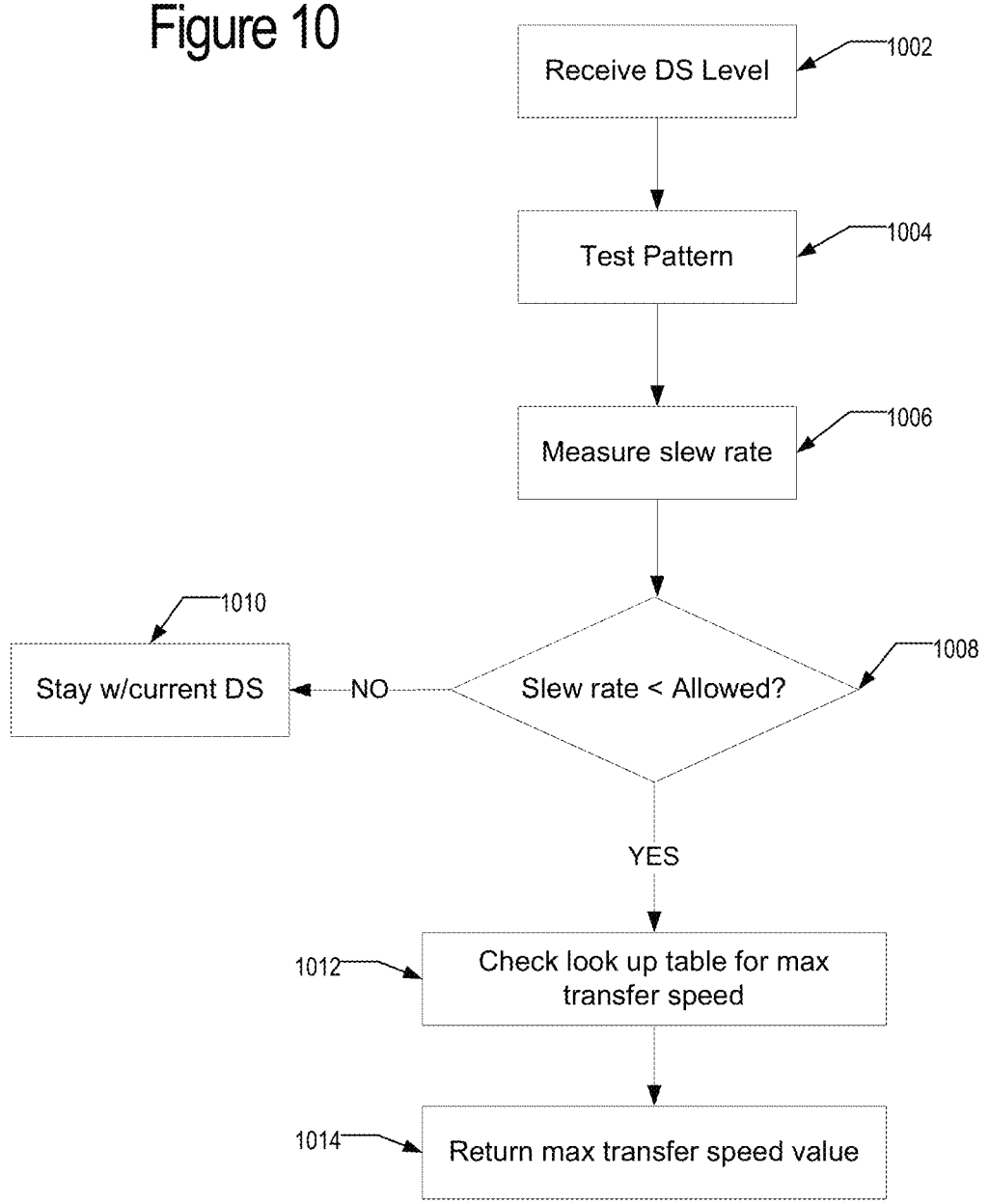
FIG. 10 is a diagram for optimizing data transfer speed.

FIG. 10 is a diagram for optimizing data transfer speed. This may be referred to as the second stage or second phase of the drive strength optimization process. In particular, FIG. 10 illustrates a determination of the maximum data transfer speed or data frequency based on the optimal drive strength from FIG. 8 and based on the current slew rate. The slew rate may be defined as the maximum rate of change of an output voltage. In block 1002, the drive strength may be received. For example, the drive strength level may be determined in block 814 of FIG. 8. In block 1004, a test pattern is implemented. The slew rate is then measured in block 1006. There may be measuring circuitry that performs the measurement. When the slew rate is not less than an allowed slew rate, the current drive strength is maintained in block 1010. When the slew rate is less than the allowed slew rate, a look-up table is referenced in block 1012 for the both the slew rate and the drive strength value to determine the maximum transfer speed for block 1014. Based on these parameters a decision to operate an on-die termination network existing in the memory may be made and the required settings may be updated by the memory controller in the memory. Table 1 is one example of a look-up table for determining a maximum transfer speed based on the slew rate and drive strength that may be generated at the manufacturing stage, but can be referenced at any point to optimize data transfer speed.

Figure 11:
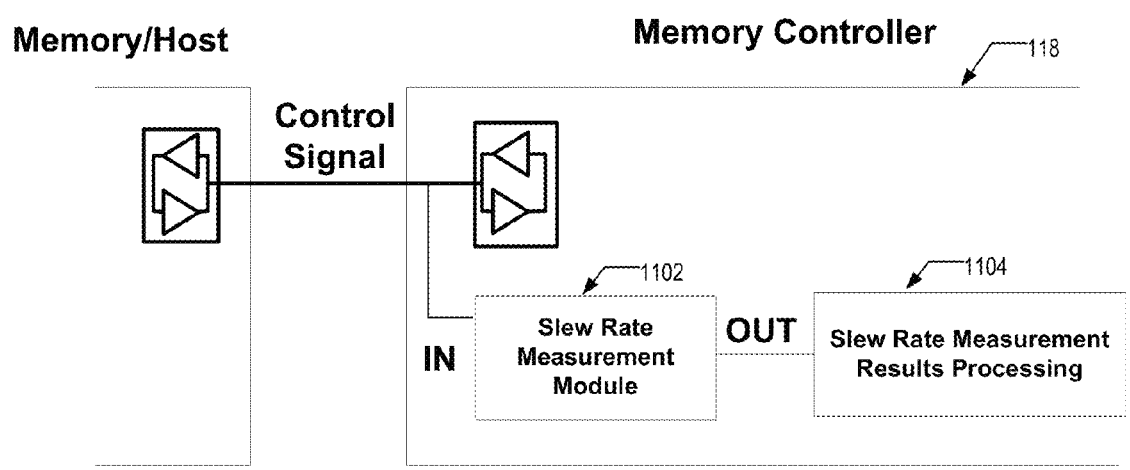
FIG. 11 is a diagram of a memory system for slew rate measurement.

FIG. 11 is an embodiment for slew rate measurement. The memory or host may communicate using a control signal with the memory controller 118. The control signal connects the memory controller 118 and the host/memory can be sensed and is used for the slew rate measurement rather than the data signal. The memory 116 and host 100 from FIG. 1 may be examples of the memory/host illustrated in FIG. 11 that communicates with the memory controller 118. The control signal channel may be sensed for slew rate measurement by the slew rate measurement module 1102, which calculates a derivative of the signal. The voltage supply signal may be the input to the slew rate measurement module 1102 while the output is the processed value of the input voltage supply signal. The slew rate measurement module 1102 may generate a derivate of its input signal that is passed to a slew rate measurement results processor 1104. The slew rate may be calculated by determining a change in voltage over time for the voltage supply signal and the value may be utilized in Table 1. The output may be processed by the slew rate measurement results processor 1104. In one embodiment, the slew rate is compared with the allowed value of slew rate as in block 1008 of FIG. 10 by the processor 1104.

Figure 12:
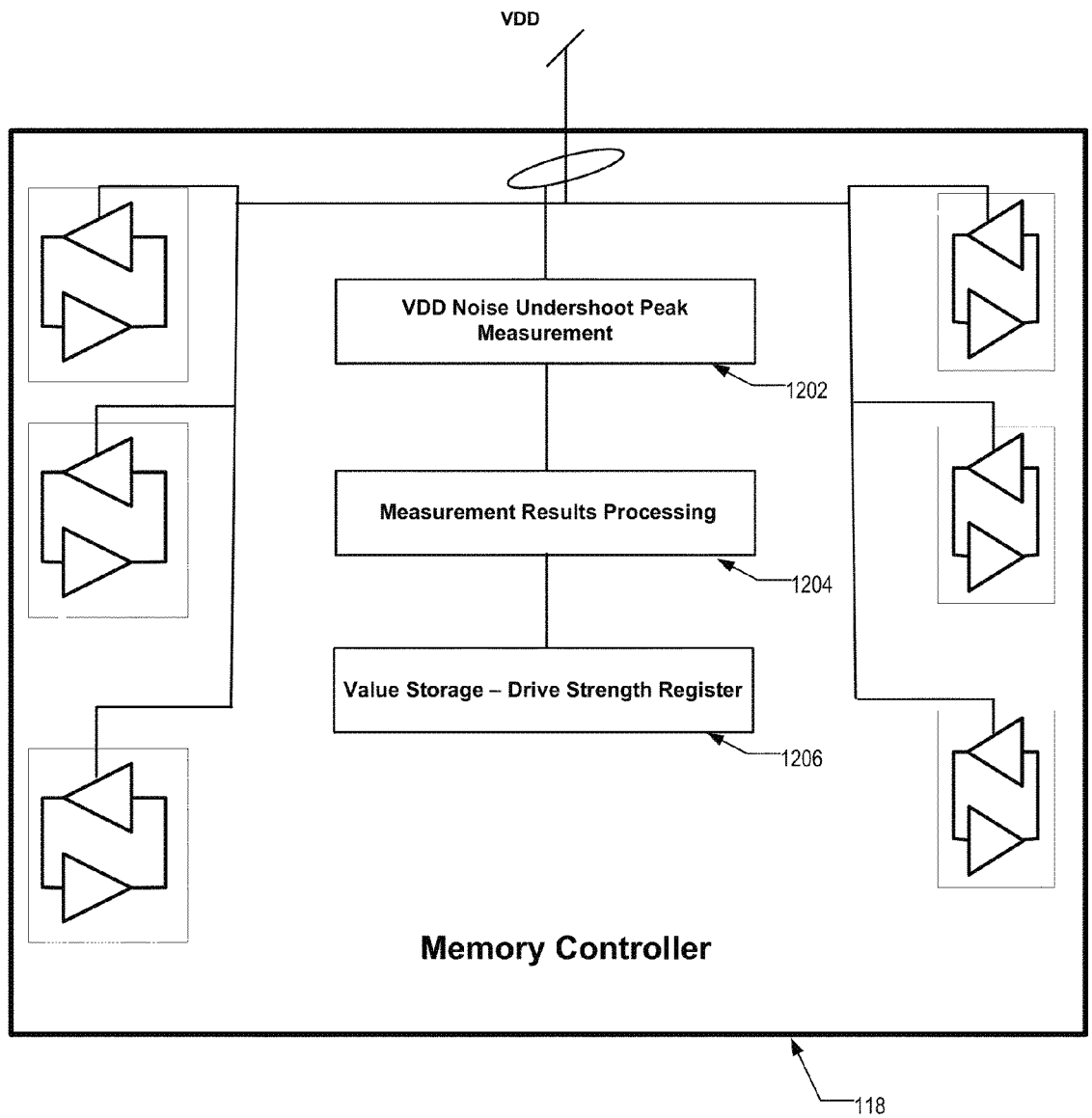
FIG. 12 is an alternative embodiment of a hardware implementation of the proposed algorithm in a memory controller.

FIG. 12 is a block diagram of one hardware implementation of the proposed algorithm in a memory controller. In particular, the memory controller 118 may be utilized for determining drive strength values. The power supply voltage VDD is provided to the memory controller 118 and a VDD noise undershoot peak measurement module 1202 measures the undershoot peak. As discussed with respect to FIG. 9, the undershoot peak may be utilized to determine a drive strength. The measurement results processing 1204 may perform the algorithm of FIG. 8 in order to identify the optimal drive strength based on the measured undershoot of the power supply. The drive strength value may be stored in the drive strength register 1206 for future reference.

Figure 13:
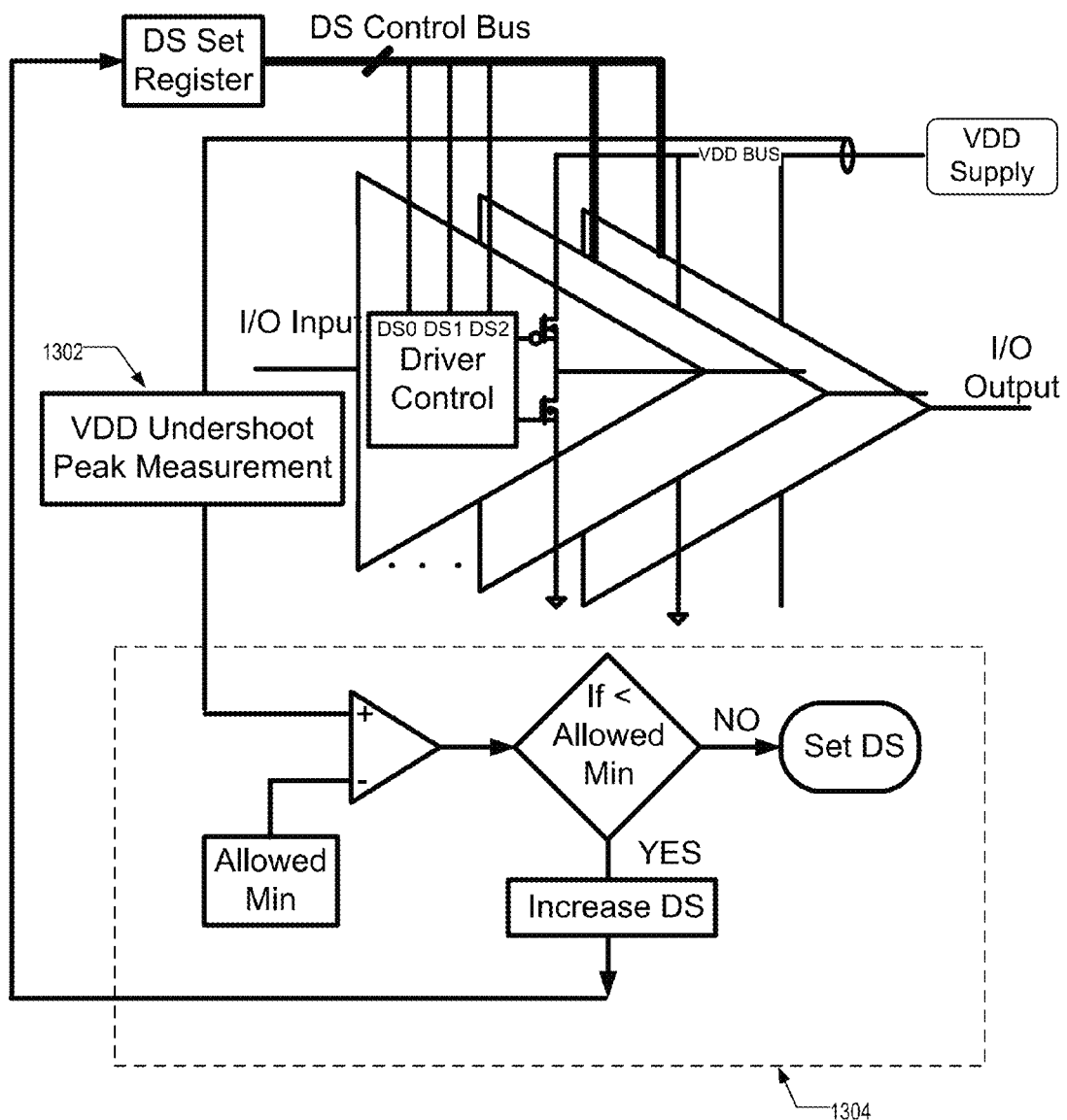
FIG. 13 is an analog circuit diagram of a hardware implementation of the drive strength optimization algorithm.
Figure 14:
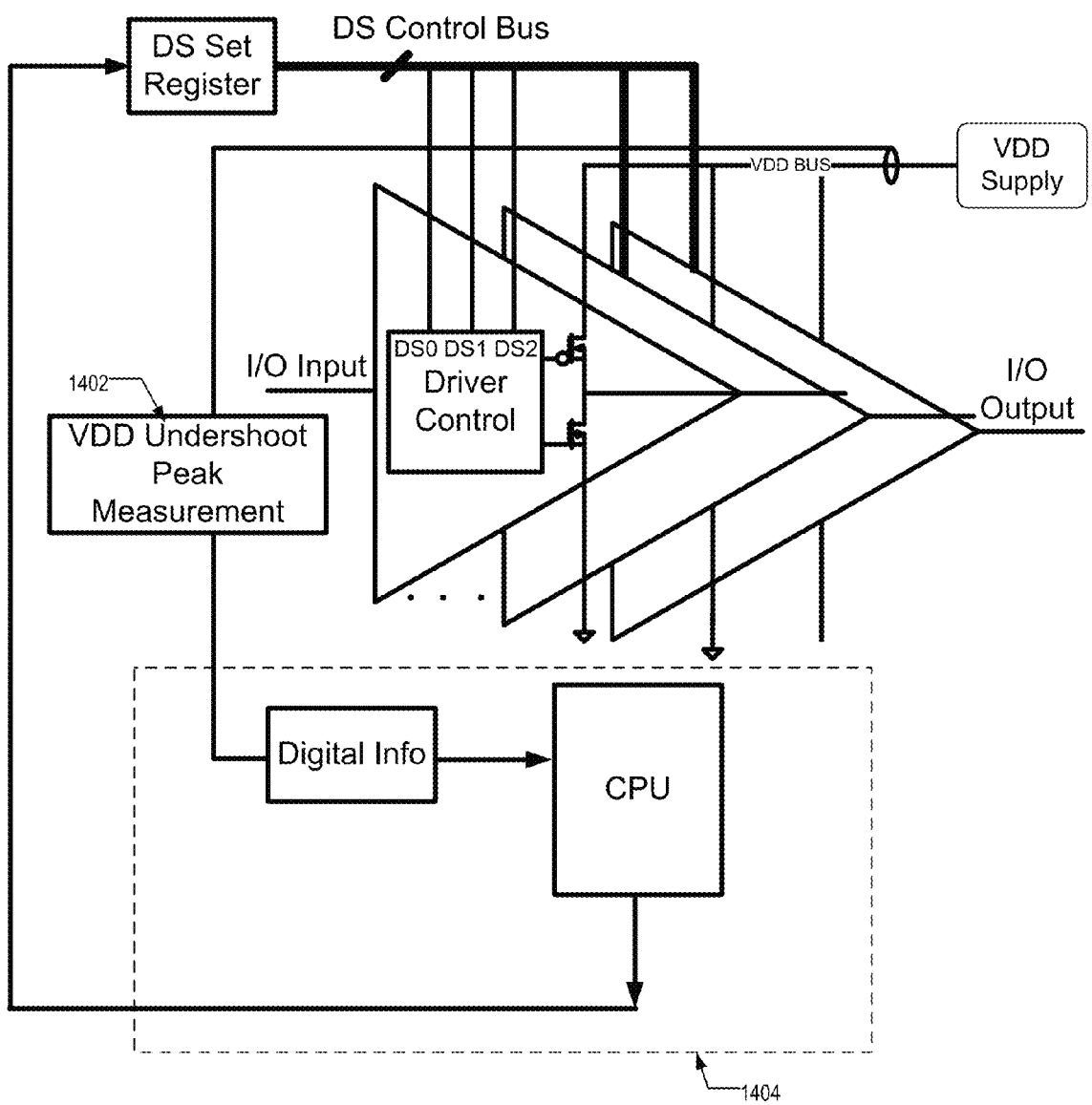
FIG. 14 is a digital circuit diagram of a hardware implementation of the drive strength optimization algorithm.

FIG. 13 is a block diagram of one hardware implementation of the drive strength optimization algorithm using an analog circuit approach. FIG. 14 is a block diagram of one hardware implementation of the drive strength optimization algorithm using a digital circuit approach. In particular, FIGS. 13-14 illustrate exemplary embodiments of circuitry that performs the algorithm illustrated in FIG. 8. FIG. 13 illustrates a undershoot peak measurement 1302 that measures the peak (compare 1202 of FIG. 12) along with measurement results processing 1304 (compare 1204 of FIG. 12). The results processing 1304 includes an allowed minimum that is compared such that the drive strength is increased until the optimal drive strength is set. Likewise, FIG. 14 illustrates a undershoot peak measurement 1402 that measures the peak (compare 1202 of FIG. 12) along with measurement results processing 1404 (compare 1204 of FIG. 12). The digital processing in FIG. 14 may utilize a CPU or processor in for the measurements results processing 1404 that determines the optimal drive strength. A drive strength set register stores the drive strength value that is communicated over the DS control bus to the I/O. As illustrated in FIGS. 13-14, the drive strength optimization may utilize a combination of analog and digital capabilities.

The drive strength optimization is dynamic and can be performed at different times depending on changes on external factors, such as process, voltage and temperature variations. The optimization may be self-optimizing and performed without external components to provide a wide range of drive strength settings. Accordingly, the same circuitry may be used for a variety of applications and high-speed interfaces. The product performance level may be improved under different operating conditions.

As used herein, "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a processor, memory device, computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A flash memory device comprising:
   a non-volatile storage having an array of memory blocks; and
   a controller in communication with the non-volatile storage, wherein the controller is configured to:
      optimize drive strength of a plurality of input/output ("I/O") devices of the controller based on detected distortions in a VDD voltage signal supplied to the I/O devices for different drive strengths by utilizing a test pattern that comprises toggling the plurality of I/O devices for a maximum current consumption;
      measure a distortion in a data signal; and
      determine, iteratively, a maximum data transfer speed based on the optimized drive strength and the measured data signal distortion from the test pattern, wherein the iterative determination comprises:
         provide the test pattern and at least one additional test pattern; and
         re-detect distortions in the VDD voltage signal supplied to the I/O devices for different drive strengths after one of the test patterns is provided.

2. The device of claim 1 wherein the distortion in the data signal comprises a delay characterized by a slew rate and the maximum data transfer speed is determined based on the slew rate.

3. The device of claim 2 further comprising termination circuitry optimization based on the slew rate.

4. The device of claim 1 wherein to optimize the drive strength, the controller is configured to:
   receive a power supply voltage at the plurality of I/O devices.

5. The device of claim 4 wherein the power supply voltage is received from a host.

6. The device of claim 1 wherein the drive strength corresponds to an output load for the plurality of I/O devices.

7. The device of claim 1 wherein to optimize the drive strength, the controller is further configured to:
   compare the detected distortions with threshold distortions; and
   identify the optimized drive strength as a maximum drive strength that results in the detected distortions remaining below the threshold distortions.

8. The device of claim 7 wherein the distortions comprise undershoot, overshoot, or delay.

9. The device of claim 8 wherein the undershoot comprises a voltage undershoot measurement inside the controller.

10. The device of claim 1 wherein the iterative determination comprises iteratively re-detecting distortions for different test patterns.

11. The device of claim 1 wherein the controller is configured to:
    re-identify the optimized drive strength as a maximum drive strength that results in the re-detected distortions below the threshold distortions.

12. The device of claim 1 wherein at least one of the additional test patterns comprise simultaneously toggling the plurality of I/O devices for a maximum current consumption from the power supply.

13. A method for optimizing drive strength in flash memory comprising:
    in a non-volatile storage device having a controller and blocks of memory, the controller:
       toggling one or more input/output ("I/O") devices of the controller using an I/O toggling mode that switches each I/O to maximize voltage level charge;
       measuring a distortion in a VDD voltage signal supplied to the one or more I/O devices caused by the toggling mode;
       comparing the distortion in the VDD voltage signal with an allowed distortion of the VDD voltage signal;
       increasing, iteratively, the drive strength of the I/O device until the distortion is more than the allowed distortion; and
       decreasing the drive strength of the I/O device when the distortion is more than the allowed distortion to generate the optimized drive strength.

14. The method of claim 13 further comprising:
    storing the optimized value of drive strength in one or more of the blocks of memory, wherein the optimized value of drive strength overwrites an initial drive strength value.

15. The method of claim 13 wherein the toggling mode comprises applying a test pattern to the one or more I/O devices that results in a maximum current consumption.

16. The method of claim 13 wherein the distortion comprises undershoot, overshoot, or delay.

17. The method of claim 13 wherein the allowed distortion comprises a maximum permissible distortion threshold.

18. The method of claim 17 wherein the optimized drive strength comprises a maximum drive strength that results in the measured distortion remaining below the threshold level.

19. The method of claim 13 wherein the optimized drive strength is utilized with a configuration parameter to identify a maximum data transfer speed.

20. The method of claim 19 wherein the configuration parameter comprises at least one of a number of dies or a slew rate.

21. A memory system comprising:
    a non-volatile storage having an array of memory blocks; and
    a controller in communication with the blocks, the controller configured to:
       receive a power supply voltage at one or more input/output ("I/O") devices;
       detect distortions in a VDD voltage signal supplied to the one or more I/O devices for different drive strengths and including when the I/O devices are each toggled for an increased voltage;
       compare the detected distortions with threshold distortions; and identify an optimized drive strength as a maximum drive strength with the detected distortions below the threshold distortions.

22. The memory system of claim 21 wherein the controller is further configured to toggle the I/O devices to maximize current consumption.

23. The memory system of claim 21 wherein the controller is further configured to:
  identify a configuration parameter, wherein the configuration parameter comprises one of a slew rate or a number of dies; and
  determine a maximum data transfer speed based on the optimized drive strength and the configuration parameter.

* * * * *